United States Patent
Saito et al.

(10) Patent No.: US 9,190,508 B2
(45) Date of Patent: Nov. 17, 2015

(54) GAN BASED SEMICONDUCTOR DEVICE

(71) Applicant: Kabushiki Kaisha Toshiba, Minato-ku (JP)

(72) Inventors: Hisashi Saito, Kawasaki (JP); Masahiko Kuraguchi, Yokohama (JP); Hitoshi Sugiyama, Ashigarashimo-gun (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/444,256

(22) Filed: Jul. 28, 2014

(65) Prior Publication Data
US 2015/0076508 A1  Mar. 19, 2015

(30) Foreign Application Priority Data
Sep. 17, 2013 (JP) .................. 2013-192416

(51) Int. Cl.
*H01L 29/15* (2006.01)
*H01L 29/778* (2006.01)
*H01L 29/20* (2006.01)
*H01L 29/205* (2006.01)
(Continued)

(52) U.S. Cl.
CPC ........ *H01L 29/7787* (2013.01); *H01L 29/2003* (2013.01); *H01L 29/205* (2013.01); *H01L 29/7783* (2013.01); *H01L 29/207* (2013.01); *H01L 29/4236* (2013.01)

(58) Field of Classification Search
CPC ............ H01L 29/7787; H01L 29/2003; H01L 29/205
See application file for complete search history.

(56) References Cited

U.S. PATENT DOCUMENTS

| 2001/0020700 A1 | 9/2001 | Inoue et al. | |
| 2003/0010993 A1* | 1/2003 | Nakamura et al. | 257/99 |
| 2005/0145883 A1* | 7/2005 | Beach et al. | 257/194 |

(Continued)

FOREIGN PATENT DOCUMENTS

| JP | 2001-196575 | 7/2001 |
| JP | 2004-22774 | 1/2004 |

(Continued)

OTHER PUBLICATIONS

Machine translation of JP2010-062381 has been attached for the rejection.*

(Continued)

*Primary Examiner* — Bilkis Jahan
(74) *Attorney, Agent, or Firm* — Oblon, McClelland, Maier & Neustadt, L.L.P.

(57) ABSTRACT

A semiconductor device according to an embodiment includes a first semiconductor layer of a first GaN based semiconductor, a second semiconductor layer of a second GaN based semiconductor having a band gap narrower than the first GaN based semiconductor, a third semiconductor layer of a third GaN based semiconductor having a band gap wider than the second GaN based semiconductor, a fourth semiconductor layer of a fourth GaN based semiconductor having a band gap narrower than the third GaN based semiconductor, a fifth semiconductor layer of a fifth GaN based semiconductor having a band gap wider than the fourth GaN based semiconductor, a gate dielectric provided directly on the third semiconductor layer, the fourth semiconductor layer, and the fifth semiconductor layer, a gate electrode provided on the gate dielectric, a source and drain electrodes provided above the fifth semiconductor layer.

9 Claims, 7 Drawing Sheets

(51) Int. Cl.
  *H01L 29/423* (2006.01)
  *H01L 29/207* (2006.01)

(56) References Cited

U.S. PATENT DOCUMENTS

| | | | |
|---|---|---|---|
| 2007/0045670 A1 | 3/2007 | Kuraguchi | |
| 2008/0093626 A1 | 4/2008 | Kuraguchi | |
| 2008/0099767 A1* | 5/2008 | Shakuda | 257/76 |
| 2009/0008677 A1* | 1/2009 | Kikkawa | 257/194 |
| 2009/0206371 A1 | 8/2009 | Oka | |
| 2011/0227033 A1* | 9/2011 | Kushibe et al. | 257/13 |
| 2011/0291160 A1 | 12/2011 | Ota et al. | |
| 2012/0223328 A1* | 9/2012 | Ikuta et al. | 257/76 |
| 2013/0069071 A1 | 3/2013 | Inoue et al. | |

FOREIGN PATENT DOCUMENTS

| | | | |
|---|---|---|---|
| JP | 2008-010803 | | 1/2008 |
| JP | 2008-103617 | | 5/2008 |
| JP | 4282708 | | 6/2009 |
| JP | 2009-200096 | | 9/2009 |
| JP | 2010062381 | * | 3/2010 ............ H01L 21/336 |
| JP | 2013-65649 | | 4/2013 |
| WO | WO 2010/092768 A1 | | 8/2010 |

OTHER PUBLICATIONS

K. Ota, et al. "A Normally-off GaN FET with High Threshold Voltage Uniformity Using a Novel Piezo Neutralization Technique", IEEE, IEDM09, 2009, 4 pages.

R. Gaska, et al., "Two-channel AlGaN/GaN heterostructure field effect transistor for high power applications", AIP Journal of Applied Physics vol. 85, No. 5, 1999, Downloaded May 16, 2013, 4 pages.

European Search Report issued Jul. 7, 2015 in European Patent Application No. 14176973-7-1552/2849230, 12 pages.

Bin Lu, et al.; "An Etch-Stop Barrier Structure for GaN High-Electron-Mobility Transistors", IEEE Electron Device Letters, vol. 34, No. 3, Mar. 2013, pp. 369-371.

* cited by examiner

GAN BASED SEMICONDUCTOR DEVICE

CROSS-REFERENCE TO RELATED APPLICATION

This application is based upon and claims the benefit of priority from Japanese Patent Application No. 2013-192416, filed on Sep. 17, 2013, the entire contents of which are incorporated herein by reference.

FIELD

Embodiments described herein relate generally to a semiconductor device.

BACKGROUND

As materials for next-generation power semiconductor devices, a GaN (gallium nitride) based semiconductor has been expected. A GaN based semiconductor device has a wide band gap and can realize a high breakdown voltage and low loss, as compared with a device of Si.

Generally, in a transistor of the GaN based semiconductor, a high electron mobility transistor (HEMT) using two-dimensional electron gas (2DEG) as carriers is adopted. However, the normal HEMT becomes a normally-on transistor in which current flows when a voltage is not applied to a gate. It is difficult to realize a normally-off transistor for HEMT. In particular, it is difficult to realize the normally-off transistor having a high threshold voltage.

DETAILED DESCRIPTION

Figure 1:
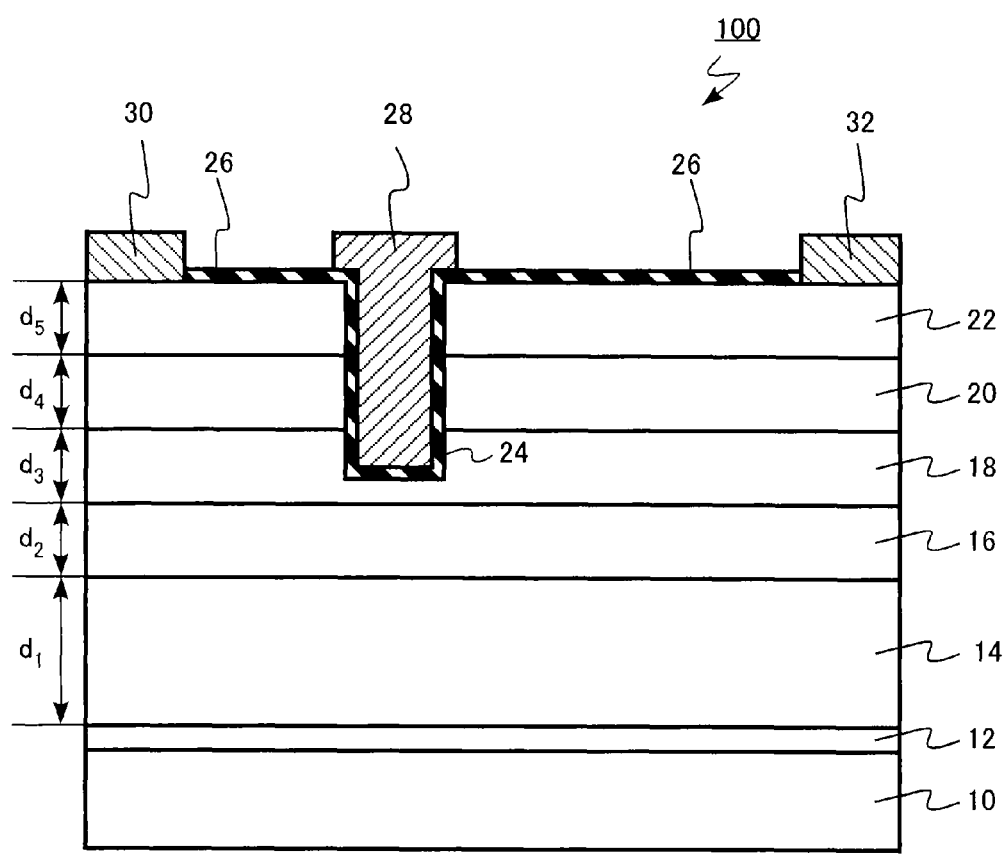
FIG. 1 is a schematic cross-sectional view illustrating a configuration of a semiconductor device according to a first embodiment.

A semiconductor device according to embodiments includes a first semiconductor layer of a first GaN based semiconductor; a second semiconductor layer of a second GaN based semiconductor provided above the first semiconductor layer, the second GaN based semiconductor having a band gap narrower than that of the first GaN based semiconductor; a third semiconductor layer of a third GaN based semiconductor provided above the second semiconductor layer, the third GaN based semiconductor having a band gap wider than that of the second GaN based semiconductor; a fourth semiconductor layer of a fourth GaN based semiconductor provided above the third semiconductor layer, the fourth GaN based semiconductor having a band gap narrower than that of the third GaN based semiconductor; a fifth semiconductor layer of a fifth GaN based semiconductor provided above the fourth semiconductor layer, the fifth GaN based semiconductor having a band gap wider than that of the fourth GaN based semiconductor; a gate dielectric provided directly on the third semiconductor layer, the fourth semiconductor layer, and the fifth semiconductor layer; a gate electrode provided on the gate dielectric; a source electrode provided above the fifth semiconductor layer; and a drain electrode provided above the fifth semiconductor layer at the side opposite to the side of the gate electrode with respect to the source electrode.

In the present specification, the "GaN based semiconductor" collectively means a semiconductor that contains GaN (gallium nitride), AlN (aluminum nitride), InN (indium nitride), and intermediate compositions thereof.

In addition, in the present specification, a "channel region" means a semiconductor region in which a potential is controlled actively by a bias applied to a gate electrode and a carrier density changes. In addition, in the present specification, an "access region" means a semiconductor region through which carriers between a source electrode and the gate electrode and between the gate electrode and a drain electrode flow.

In addition, in the present specification, "on", "above" and "below" are terms indicating a relative position relation between components, but are not necessarily terms based on a gravity direction.

First Embodiment

A semiconductor device according to this embodiment includes a first semiconductor layer of a first GaN based semiconductor, a second semiconductor layer of a second GaN based semiconductor that is provided on the first semiconductor layer and has a band gap narrower than that of the first GaN based semiconductor, a third semiconductor layer of a third GaN based semiconductor that is provided on the second semiconductor layer and has a band gap wider than that of the second GaN based semiconductor, a fourth semiconductor layer of a fourth GaN based semiconductor that is provided on the third semiconductor layer and has a band gap narrower than that of the third GaN based semiconductor, a fifth semiconductor layer of a fifth GaN based semiconductor that is provided on the fourth semiconductor layer and has a band gap wider than that of the fourth GaN based semiconductor, a gate dielectric that is provided on the third semiconductor layer, the fourth semiconductor layer, and the fifth semiconductor layer, a gate electrode that is provided on the third semiconductor layer, the fourth semiconductor layer, and the fifth semiconductor layer through the gate dielectric therebetween, a source electrode that is provided on the fifth semiconductor layer, and a drain electrode that is provided on the fifth semiconductor layer at the side opposite to the side of the gate electrode with respect to the source electrode.

FIG. 1 is a schematic cross-sectional view illustrating a configuration of the semiconductor device according to this embodiment. The semiconductor device according to this embodiment is a horizontal transistor using a GaN based semiconductor.

A transistor 100 according to this embodiment includes a substrate 10, a buffer layer 12 that is formed on the substrate 10, a first semiconductor layer 14 that is formed on the buffer layer 12, a second semiconductor layer 16 that is formed on the first semiconductor layer 14, a third semiconductor layer 18 that is formed on the second semiconductor layer 16, a fourth semiconductor layer 20 that is formed on the third semiconductor layer 18, and a fifth semiconductor layer 22 that is formed on the fourth semiconductor layer 20.

For example, the substrate 10 is made of silicon (Si). In addition to the silicon, sapphire ($Al_2O_3$) or silicon carbide (SiC) can be applied.

The buffer layer 12 has a function of accommodating lattice mismatching between the substrate 10 and the first semiconductor layer 14. The buffer layer 12 is formed with a multi-layer structure such as aluminum gallium nitride (AlxGa1-xN (0<X<1)) or aluminum nitride (AlN).

The first semiconductor layer 14, the second semiconductor layer 16, the third semiconductor layer 18, the fourth semiconductor layer 20, and the fifth semiconductor layer 22 are formed of the first GaN based semiconductor, the second GaN based semiconductor, the third GaN based semiconductor, the fourth GaN based semiconductor, and the fifth GaN based semiconductor, respectively. In addition, the second GaN based semiconductor has a band gap narrower than that of the first GaN based semiconductor. In addition, the third GaN based semiconductor has a band gap wider than that of the second GaN based semiconductor. In addition, the fourth GaN based semiconductor has a band gap narrower than that of the third GaN based semiconductor. In addition, the fifth GaN based semiconductor has a band gap wider than that of the fourth GaN based semiconductor.

Therefore, the transistor 100 has a layer structure in which the second semiconductor layer 16 having the relatively narrow band gap is interposed by the first semiconductor layer 14 and the third semiconductor layer 18 having the relatively wide band gaps and the fourth semiconductor layer 20 having the relatively narrow band gap is interposed by the third semiconductor layer 18 and the fifth semiconductor layer 22 having the relatively wide band gap. A magnitude relation of the band gaps of the GaN based semiconductors can be determined by analyzing compositions of the GaN based semiconductors.

For example, the first GaN based semiconductor has a composition represented by $Al_{X1}In_{Y1}Ga_{1-(X1+Y1)}N$ (0≤X1≤1, 0≤Y1≤1, and 0≤X1+Y1<1), the second GaN based semiconductor has a composition represented by $Al_{X2}In_{Y2}Ga_{1-(X2+Y2)}N$ (0≤X2≤1, 0≤Y2≤1, and 0≤X2+Y2<1), the third GaN based semiconductor has a composition represented by $Al_{X3}In_{Y3}Ga_{1-(X3+Y3)}N$ (0≤X3≤1, 0≤Y3≤1, and 0≤X3+Y3<1), the fourth GaN based semiconductor has a composition represented by $Al_{X4}In_{Y4}Ga_{1-(X4+Y4)}N$ (0≤X4≤1, 0≤Y4≤1, and 0≤X4+Y4<1), and the fifth GaN based semiconductor has a composition represented by $Al_{X5}In_{Y5}Ga_{1-(X5+Y5)}N$ (0≤X5≤1, 0≤Y5≤1, and 0≤X5+Y5<1).

For example, X1+Y1, X2+Y2, X3+Y3, X4+Y4, and X5+Y5 satisfy relations of X1+Y1>X2+Y2, X3+Y3>X2+Y2, and X5+Y5>X4+Y4. As a result, a magnitude relation of the band gaps is satisfied.

In addition, the first semiconductor layer 14, the second semiconductor layer 16, the third semiconductor layer 18, the fourth semiconductor layer 20, and the fifth semiconductor layer 22 have the thickness ($d_1$), the thickness ($d_2$), the thickness ($d_3$), the thickness ($d_4$), and the thickness ($d_5$), respectively.

The first GaN based semiconductor to form the first semiconductor layer 14 is, for example, undoped AlGaN (aluminum gallium nitride). The first GaN based semiconductor may contain impurities such as C (carbon) to achieve a high breakdown voltage. A thickness ($d_1$) of the first semiconductor layer 14 is, for example, 0.5 μm to 3 μm.

The first semiconductor layer 14 functions as a threshold control layer to increase a potential of the second semiconductor layer 16 and increase a threshold voltage of the transistor 100. The thickness ($d_1$) of the first semiconductor layer 14 is preferably larger than a thickness ($d_2$) of the second semiconductor layer 16, from the viewpoint of increasing the threshold voltage of the transistor 100.

The second GaN based semiconductor to form the second semiconductor layer 16 is, for example, undoped GaN (gallium nitride). The thickness ($d_2$) of the second semiconductor layer 16 is, for example, 3 nm to 300 nm.

The third GaN based semiconductor to form the third semiconductor layer 18 is, for example, undoped AlGaN (aluminum gallium nitride). A thickness ($d_3$) of the third semiconductor layer 18 is, for example, 5 nm to 30 nm.

A hetero-junction is formed at the interface of the second semiconductor layer 16 and the third semiconductor layer 18. At the interface, two-dimensional electron gas (2DEG) is generated and becomes carriers of the transistor 100. That is, the second semiconductor layer 16 functions as the operation layer (carrier layer) of the HEMT and the third semiconductor layer 18 functions as the barrier layer (electron supply layer) of the HEMT.

The fourth GaN based semiconductor to form the fourth semiconductor layer 20 is, for example, undoped GaN (gallium nitride). A thickness ($d_4$) of the fourth semiconductor layer 20 is, for example, 3 nm to 50 nm.

The fifth GaN based semiconductor to form the fifth semiconductor layer 22 is, for example, undoped AlGaN (aluminum gallium nitride). The fifth GaN based semiconductor may be n-type semiconductor. The fifth GaN based semiconductor may contain n-type impurities such as Si (silicon) or Ge (germanium). A thickness ($d_5$) of the fifth semiconductor layer 22 is, for example, 3 nm to 30 nm.

A hetero-junction is formed at the interface of the fourth semiconductor layer 20 and the fifth semiconductor layer 22. At the interface, two-dimensional electron gas (2DEG) is generated and becomes carriers of the transistor 100. That is, the fourth semiconductor layer 20 functions as the operation layer (carrier layer) of the HEMT and the fifth semiconductor layer 22 functions as the barrier layer (electron supply layer) of the HEMT.

The transistor 100 includes a trench 24 in which one end is positioned at the fifth semiconductor layer 22 and the other end is positioned at the third semiconductor layer 18. The trench 24 is formed to reach the third semiconductor layer 18 by penetrating the fourth semiconductor layer 20 from a surface of the fifth semiconductor layer 22 using a reactive ion etching (RIE) method.

In addition, the gate dielectric (gate insulating film) 26 is provided on an inner wall of the trench 24. The gate dielectric 26 covers a sidewall of the trench 24. The gate dielectric 26 is provided continuously on the third semiconductor layer 18, the fourth semiconductor layer 20, and the fifth semiconductor layer 22 of the inner wall of the trench 24. The gate dielectric 26 is, for example, a silicon oxide film. In addition to the silicon oxide film, other materials such as a silicon nitride film, a silicon oxynitride film, and an aluminum oxide film can be applied. The thickness of the gate dielectric 26 is, for example, 10 nm to 100 nm.

The gate electrode 28 is formed on the gate dielectric 26. The gate electrode 28 is embedded in the trench 24. The gate electrode 28 is provided on the third semiconductor layer 18, the fourth semiconductor layer 20, and the fifth semiconductor layer 22 through the gate dielectric 26 therebetween. The gate electrode 28 may be p-type polysilicon in which B (boron) is doped or n-type polysilicon in which P (phosphorus) is doped. In addition to the polysilicon, metal silicide and a metal can be applied to the gate electrode 30.

In addition, the source electrode 30 and the drain electrode 32 are formed on the fifth semiconductor layer 22. The drain electrode 32 is formed at the side opposite to the side of the gate electrode 28 with respect to the source electrode 30.

The source electrode 30 and the drain electrode 32 are, for example, metal electrodes and the metal electrodes are, for example, electrodes using aluminum (Al) as a main component. A portion between the source electrode 30 and the drain electrode 32 and the fifth semiconductor layer 22 is preferably an ohmic contact. A distance between the source electrode 30 and the drain electrode 32 is about 10 μm.

Figure 2:
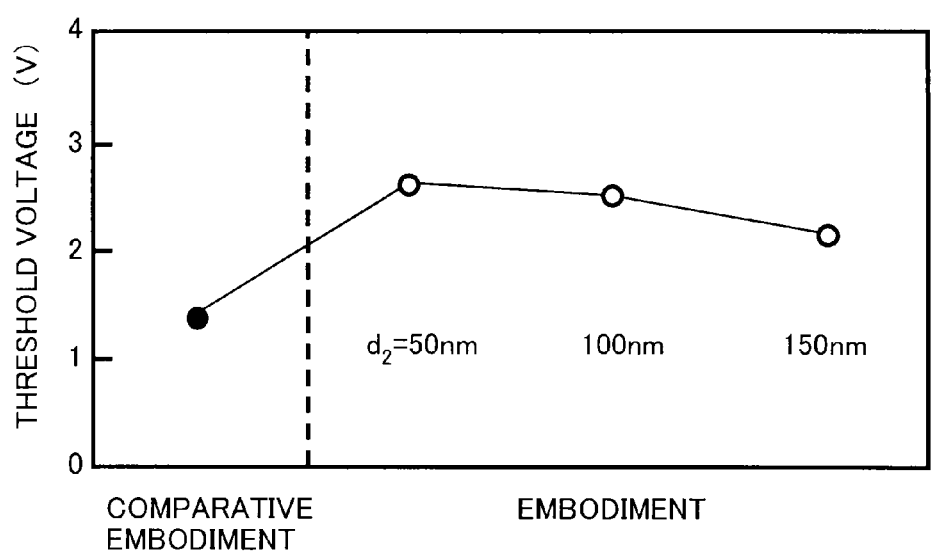
FIG. 2 is a diagram illustrating a boosting effect of a threshold voltage of the semiconductor device according to the first embodiment.

FIG. 2 is a diagram illustrating a boosting effect of a threshold voltage of the semiconductor device according to this embodiment. FIG. 2 illustrates the boosting effect of the threshold voltage of the transistor 100 by the first semiconductor layer 14 to be the threshold control layer. FIG. 2 illustrates a result obtained by measuring the threshold voltage of the transistor in the case in which the threshold control layer of AlGaN is provided below an operation layer of GaN in an HEMT including the operation layer of GaN and a barrier layer of AlGaN as in this embodiment and the case in which the threshold control layer of AlGaN is not provided below the operation layer of GaN in the HEMT (comparative embodiment). The thickness ($d_2$) of the operation layer (corresponding to the second semiconductor layer 16) on the threshold control layer is set as a parameter.

As apparent from FIG. 2, the threshold voltage is increased by providing the threshold control layer. This is because the potential of the operation layer is increased by the threshold control layer and thus, a two-dimensional electron gas density in a hetero-junction of an interface of the operation layer and the barrier layer decreases.

In addition, the threshold voltage depends on the thickness ($d_2$) of the operation layer (corresponding to the second semiconductor layer 16). When the thickness ($d_2$) is more than 100 nm, the boosting effect of the threshold voltage decreases. Therefore, the thickness ($d_2$) of the second semiconductor layer 16 is preferably 100 nm or less and is more preferably 50 nm or less.

Figure 3:
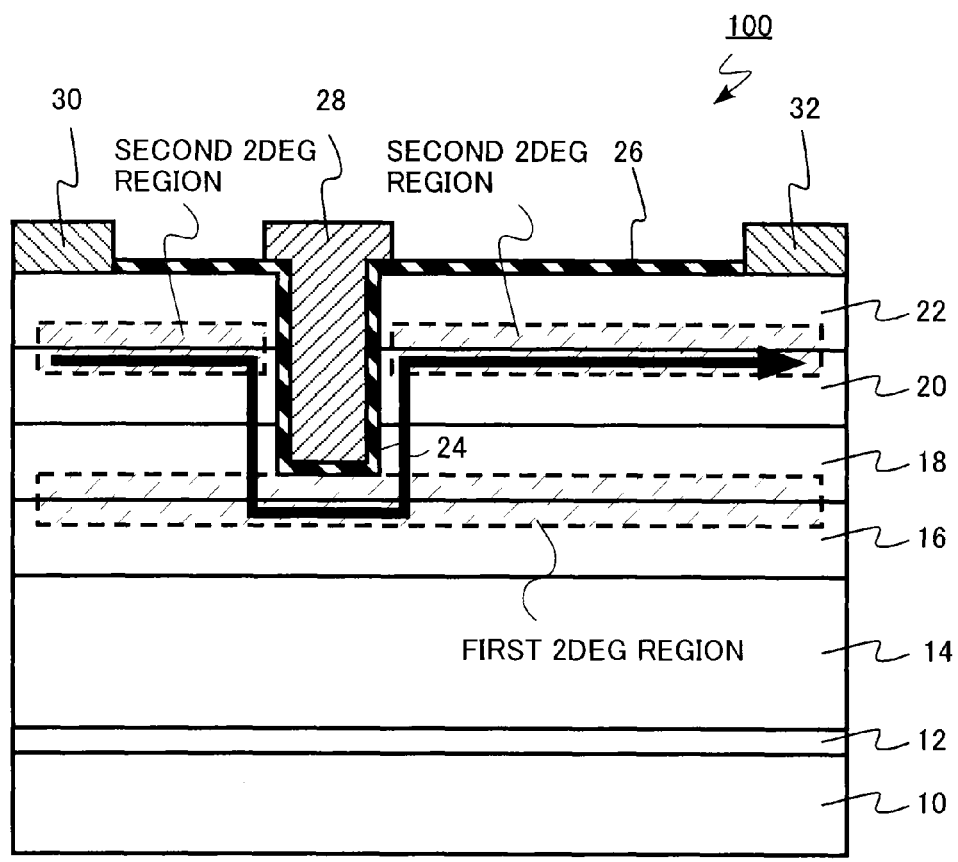
FIG. 3 is a diagram illustrating a function and an effect of the semiconductor device according to the first embodiment.

FIG. 3 is a diagram illustrating a function and an effect of the semiconductor device according to this embodiment. As described above, the first semiconductor layer 14 having the band gap wider than that of the second semiconductor layer 16 is provided as the threshold control layer below the second semiconductor layer 16 and thus, a threshold voltage of a normally-off transistor can be increased. This is because a density of two-dimensional electron gas (in FIG. 3, represented by a first 2DEG region) at the interface of the second semiconductor layer 16 and the third semiconductor layer 18 decreases as described above and a carrier density decreases.

For this reason, when the first 2DEG region is used as an access region between a source electrode and a gate electrode and between the gate electrode and a drain electrode, the carrier density is low and thus, on-resistance of the transistor increases and an on-current of the transistor decreases.

In the transistor 100 according to this embodiment, a second 2DEG region where the two-dimensional electron gas is generated at an interface of the fourth semiconductor layer 20 and the fifth semiconductor layer 22 is provided. The second 2DEG region is far from the first semiconductor layer 14, as compared with the first 2DEG region. Therefore, an influence of a boosting effect of the potential by the first semiconductor layer 14 is small. Thus, the two-dimensional electron gas density does not decrease and the high carrier density is maintained.

In FIG. 3, a current path when the transistor 100 is turned on is shown by an arrow. As shown by the arrow, in the access region between the source electrode and the gate electrode and between the gate electrode and the drain electrode, a current flows through the second 2DEG region having the high carrier density. Therefore, the on-resistance decreases and the on-current increases.

Meanwhile, a channel region immediately below the gate electrode becomes the first 2DEG region where the boosting effect of the potential by the first semiconductor layer 14 becomes remarkable. Therefore, the threshold voltage of the transistor 100 can be maintained high.

Figure 4:
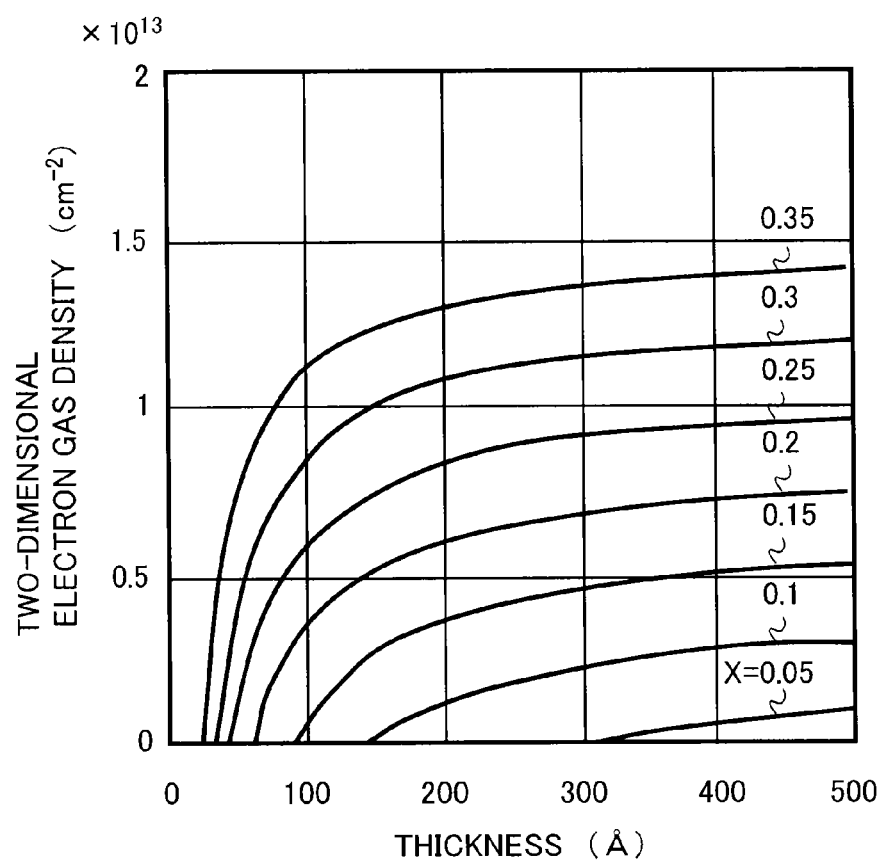
FIG. 4 is a diagram illustrating a relation of a composition and a thickness of a barrier layer of an HEMT and a two-dimensional electron gas density.

FIG. 4 is a diagram illustrating a relation of a composition and a thickness of a barrier layer of the HEMT and a two-dimensional electron gas density. The operation layer is formed of GaN and the barrier layer is formed of aluminum gallium nitride (($Al_xGa_{1-x}N$ (0<X<1)). In FIG. 4, a horizontal axis shows the thickness of the barrier layer and a vertical axis shows the two-dimensional electron gas density of the hetero-junction. An Al composition of the aluminum gallium nitride is changed in a range of X=0.05 to X=0.35.

As apparent from FIG. 4, if a ratio of Al (aluminum) is high and the thickness is large, the two-dimensional electron gas density increases. Therefore, a ratio of Al of the fifth semiconductor layer 22 is preferably higher than a ratio of Al of the third semiconductor layer 20, from the viewpoint of the two-dimensional electron gas density of the second 2DEG region being higher than the two-dimensional electron gas density of the first 2DEG region. Thus, X3 and X5 showing the ratios of Al preferably satisfy a relation of X5>X3.

In addition, a ratio of Al of the first semiconductor layer 14 is preferably low, from the viewpoint of lattice matching with the second semiconductor layer 16. Therefore, X1, X3, and X5 preferably satisfy a relation of X5>X3≥X1.

In addition, n-type impurities, for example, Si (silicon) is preferably contained in the fifth semiconductor layer 22. The fifth semiconductor layer 22 contains n-type impurities and thus, an electron density of the fifth semiconductor layer 22 increases. Therefore, an amount of electrons supplied to the second 2DEG region increases and the two-dimensional electron gas density of the second 2DEG region further increases. Therefore, the on-resistance of the transistor 100 further decreases.

In addition, a ratio of In (indium) of the fifth semiconductor layer 22 is preferably higher than a ratio of In (indium) of the third semiconductor layer 20. That is, Y3 and Y5 showing the ratios of In preferably satisfy a relation of Y5>Y3. As the ratio of In increases, the two-dimensional electron gas density increases. Therefore, the two-dimensional electron gas density of the second 2DEG region further increases. Thus, the on-resistance of the transistor 100 further decreases. Also, the thickness of the fifth semiconductor layer 22 can be decreased and productivity is improved.

In addition, the thickness (d1) of the first semiconductor layer 14 to be the threshold control layer is preferably 0.5 μm to 3 μm and is more preferably 1 μm or more. In addition, if the thickness is smaller than the thickness in the above range, an effect of increasing the potential may not be sufficiently obtained. In addition, if the thickness is larger than the thickness in the above range, productivity at the time of manufacturing may be lowered.

In addition, the thickness ($d_2$) of the second semiconductor layer 16 to be the operation layer is preferably 3 nm to 300 nm, is more preferably 100 nm or less, and is further preferably 50 nm or less. If the thickness is smaller than the thickness in the above range, it may become difficult to control the thickness. In addition, if the thickness is larger than the thickness in the above range, an effect of increasing the potential may not be sufficiently obtained.

In addition, the thickness ($d_3$) of the third semiconductor layer 18 to be the barrier layer is preferably 3 nm to 30 nm and is more preferably 5 nm to 10 nm. If the thickness is smaller than the thickness in the above range, it may become difficult to control the thickness. In addition, if the thickness is smaller than the thickness in the above range, it may become difficult to control to position a bottom portion of the trench 24 in the third semiconductor layer 18, when the trench 24 is formed. In addition, if the thickness is larger than the thickness in the above range, resistance when electrons move to a sidewall of the trench 24 increases and the on-resistance of the transistor 100 may increase.

In addition, the thickness ($d_4$) of the fourth semiconductor layer 20 to be the operation layer is preferably 3 nm to 50 nm and is more preferably 5 nm to 20 nm. If the thickness is smaller than the thickness in the above range, it may become difficult to control the thickness. In addition, if the thickness is larger than the thickness in the above range, resistance when electrons move to a sidewall of the trench 24 increases and the on-resistance of the transistor 100 may increase.

In addition, the thickness ($d_5$) of the fifth semiconductor layer 22 to be the barrier layer is preferably 3 nm to 30 nm and is more preferably 5 nm to 10 nm. If the thickness is smaller than the thickness in the above range, it may become difficult to control the thickness. In addition, if the thickness is smaller than the thickness in the above range, the electron density of the second 2DEG region may decrease. In addition, if the thickness is larger than the thickness in the above range, the thickness may excessively increase and productivity may be lowered.

As described above, according to the transistor 100 according to this embodiment, the threshold control layer and the two hetero-junctions are provided and the two 2DEG regions are formed. As a result, both the increase in the threshold voltage of the channel region and the decrease in the resistance of the access region can be realized. Therefore, a normally-off transistor in which a threshold voltage is high and an on-current is high can be realized.

Second Embodiment

A semiconductor device according to this embodiment is the same as the semiconductor device according to the first embodiment, except that an AlN (aluminum nitride) layer is provided between a third semiconductor layer and a fourth semiconductor layer. Therefore, a description of content overlapped to the content of the first embodiment is omitted.

Figure 5:
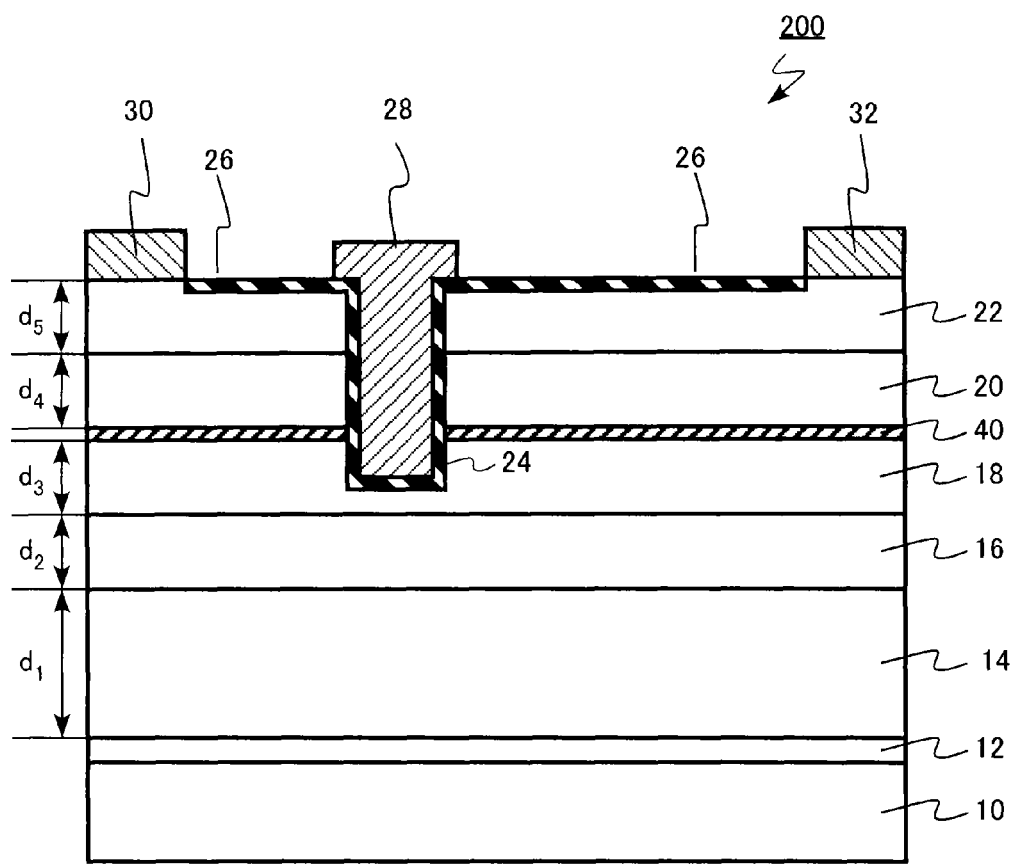
FIG. 5 is a schematic cross-sectional view illustrating a configuration of a semiconductor device according to a second embodiment.

FIG. 5 is a schematic cross-sectional view illustrating a configuration of the semiconductor device according to this embodiment. The semiconductor device according to this embodiment is a horizontal transistor using a GaN based semiconductor.

As illustrated in FIG. 5, in a transistor 200, an aluminum nitride (AlN) layer 40 is provided between a third semiconductor layer 18 and a fourth semiconductor layer 20. A bottom portion of a trench 24 is positioned at the third semiconductor layer 18. AlN can decrease an etching rate when the trench 24 is formed, with respect to AlGaN or GaN containing Ga. In other words, AlN can easily obtain high etching selection ratio, with respect to AlGaN or GaN.

Accordingly, in the semiconductor device according to this embodiment, etching can be stopped by an AlN layer 40, when the etching is performed to form the trench 24. Then, the third semiconductor layer 18 is etched. Therefore, controllability of a trench depth when the trench 24 is formed is improved. Therefore, controllability of the thickness of the third semiconductor layer 18 of the lower portion of the trench 24 is also improved. Thus, controllability of a threshold voltage is also improved. In addition, a thickness ($d_3$) of the third semiconductor layer 18 can be decreased and on-resistance of the transistor 200 can be decreased.

The thickness of the AlN layer 40 is preferably 1 nm to 10 nm and is more preferably 5 nm to 8 nm. If the thickness is smaller than the thickness in the above range, it may become difficult to control the thickness. In addition, a problem may occur in stopper performance when the trench 24 is formed. In addition, if the thickness is larger than the thickness in the above range, resistance when electrons move to a sidewall of the trench 24 increases and the on-resistance of the transistor 200 may increase.

Third Embodiment

A semiconductor device according to this embodiment includes a first semiconductor layer of a first GaN based semiconductor, a second semiconductor layer of a second GaN based semiconductor that is provided on the first semiconductor layer and has a band gap narrower than that of the first GaN based semiconductor, a third semiconductor layer of a third GaN based semiconductor that is provided on the second semiconductor layer and has a band gap wider than that of the second GaN based semiconductor, a fourth semiconductor layer of a fourth GaN based semiconductor that is provided on the third semiconductor layer and has a band gap narrower than that of the third GaN based semiconductor, a fifth semiconductor layer of a fifth GaN based semiconductor that is provided on the fourth semiconductor layer and has a band gap wider than that of the fourth GaN based semiconductor, an AlN layer that is provided between the third semiconductor layer and the fourth semiconductor layer, a gate dielectric that is provided on the AlN layer, the fourth semiconductor layer, and the fifth semiconductor layer, a gate electrode that is provided on the AlN layer, the fourth semiconductor layer, and the fifth semiconductor layer through the gate dielectric therebetween, a source electrode that is provided on the fifth semiconductor layer, and a drain electrode that is provided on the fifth semiconductor layer at the side opposite to the side of the gate electrode with respect to the source electrode.

The third embodiment is the same as the first embodiment, except that an aluminum nitride (AlN) layer is provided between the third semiconductor layer and the fourth semiconductor layer and a bottom portion of a trench is positioned at the aluminum nitride (AlN) layer. Therefore, a description of content overlapped to the content of the first embodiment is omitted.

Figure 6:
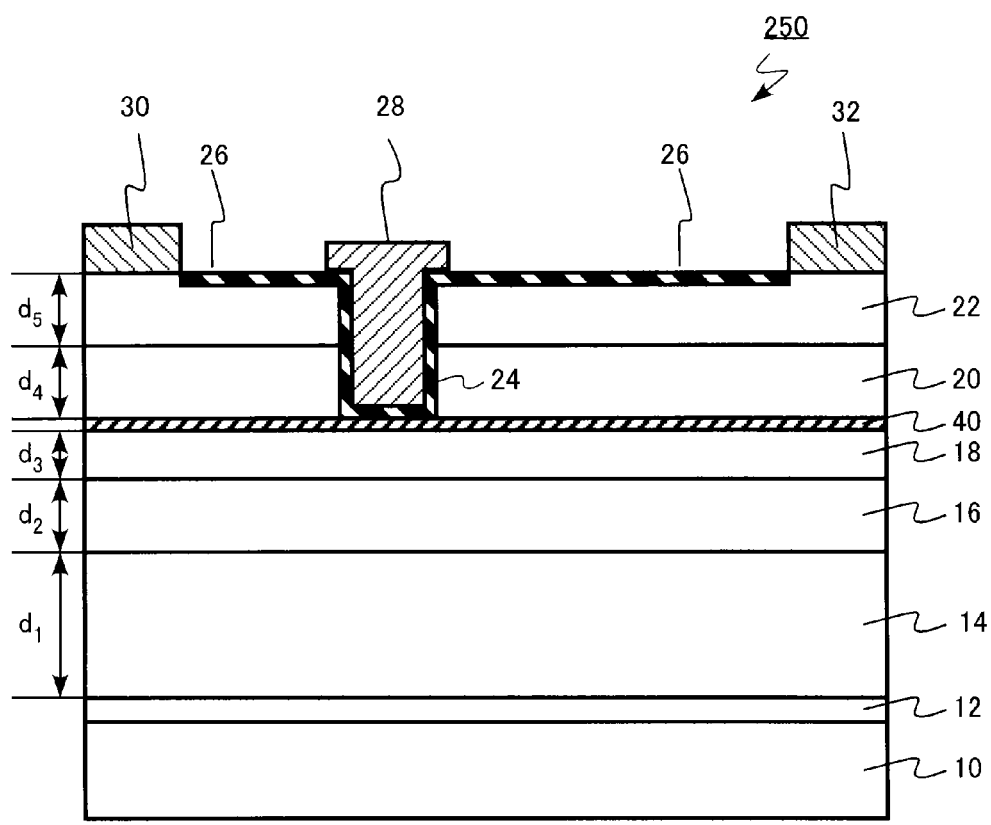
FIG. 6 is a schematic cross-sectional view illustrating a configuration of a semiconductor device according to a third embodiment.

FIG. 6 is a schematic cross-sectional view illustrating a configuration of the semiconductor device according to this embodiment. The semiconductor device according to this embodiment is a horizontal transistor using a GaN based semiconductor.

As illustrated in FIG. 6, in a transistor 250, an aluminum nitride (AlN) layer 40 is provided between a third semiconductor layer 18 and a fourth semiconductor layer 20. A bottom portion of a trench 24 is positioned at the aluminum nitride (AlN) layer 40. A gate dielectric 26 is provided on the AlN layer 40, the fourth semiconductor layer 20, and the fifth semiconductor layer 22. A gate electrode 28 is provided on the AlN layer 40, the fourth semiconductor layer 20, and the fifth semiconductor layer 22 through the gate dielectric therebetween.

A hetero-junction is formed at the interface of the second semiconductor layer 16 and the third semiconductor layer 18. At the interface, two-dimensional electron gas (2DEG) is generated and becomes carriers of the transistor 250. That is, the second semiconductor layer 16 functions as the operation layer (carrier layer) of the HEMT and the third semiconductor layer 18 functions as the barrier layer (electron supply layer) of the HEMT.

AlN can decrease an etching rate when the trench 24 is formed, with respect to AlGaN or GaN containing Ga. In other words, AlN can easily obtain high etching selection ratio, with respect to AlGaN or GaN.

Therefore, in the semiconductor device according to this embodiment, etching can be stopped by the AlN layer 40, when the etching is performed to form the trench 24. Therefore, controllability of a trench depth when the trench 24 is formed is improved. As a result, controllability of a threshold voltage is also improved. In addition, a thickness ($d_3$) of the third semiconductor layer 18 can be decreased and on-resistance of the transistor 250 can be decreased.

The thickness of the AlN layer 40 of the bottom portion of the trench 24 is preferably small, from the viewpoint of decreasing an influence of a hetero-interface of the AlN layer 40 and the third semiconductor layer 18 on an operation of the transistor 250. The thickness of the AlN layer 40 of the bottom portion of the trench 24 is preferably 0.5 nm to 2 nm.

The thickness ($d_3$) of the third semiconductor layer 18 is preferably 5 nm to 10 nm, from securing controllability of the threshold voltage of the transistor 250.

Fourth Embodiment

A semiconductor device according to this embodiment includes a first semiconductor layer of a first GaN based semiconductor, a second semiconductor layer of a second GaN based semiconductor that is provided on the first semiconductor layer and has a band gap narrower than that of the first GaN based semiconductor, a third semiconductor layer of a third GaN based semiconductor that is provided on the second semiconductor layer and has a band gap wider than that of the second GaN based semiconductor, a fourth semiconductor layer of a fourth GaN based semiconductor that is provided on the third semiconductor layer and has a band gap narrower than that of the third GaN based semiconductor, a fifth semiconductor layer of a fifth GaN based semiconductor that is provided on the fourth semiconductor layer and has a band gap wider than that of the fourth GaN based semiconductor, an AlN layer that is provided between the second semiconductor layer and the third semiconductor layer, a gate dielectric that is provided on the AlN layer, the third semiconductor layer, the fourth semiconductor layer, and the fifth semiconductor layer, a gate electrode that is provided on the AlN layer, the third semiconductor layer, the fourth semiconductor layer, and the fifth semiconductor layer through the gate dielectric therebetween, a source electrode that is provided on the fifth semiconductor layer, and a drain electrode that is provided on the fifth semiconductor layer at the side opposite to the side of the gate electrode with respect to the source electrode.

Figure 7:
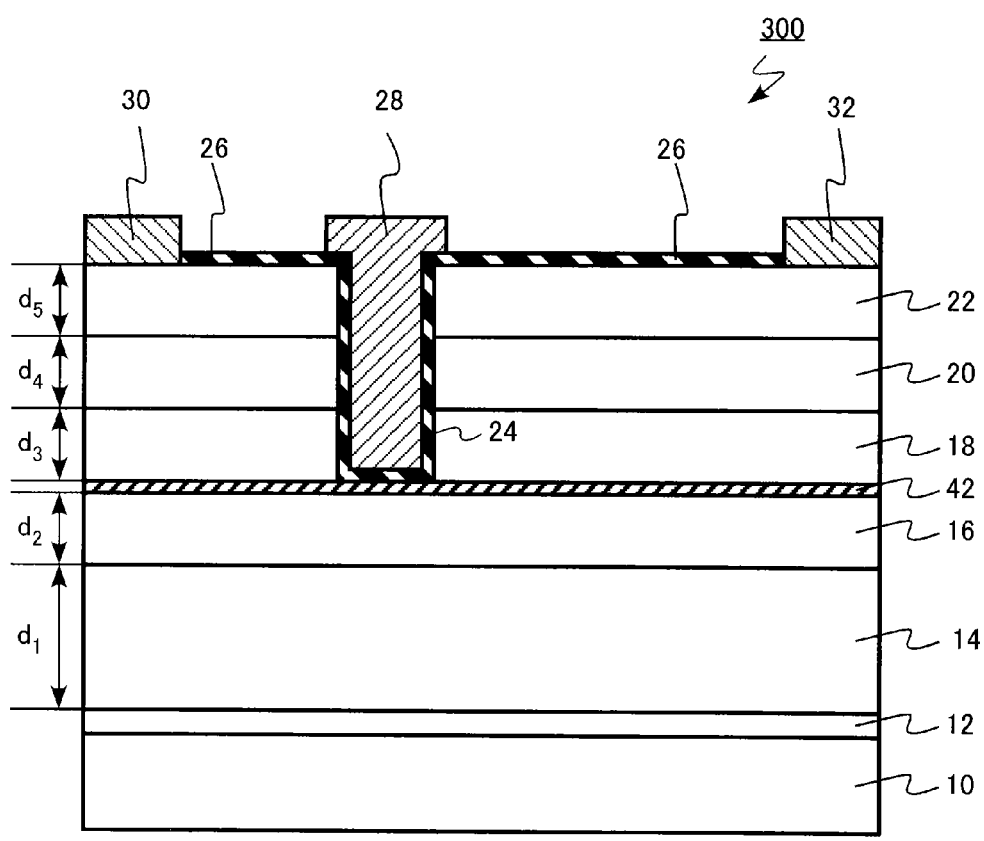
FIG. 7 is a schematic cross-sectional view illustrating a configuration of a semiconductor device according to a fourth embodiment.

FIG. 7 is a schematic cross-sectional view illustrating a configuration of the semiconductor device according to this embodiment. The semiconductor device according to this embodiment is a horizontal transistor using a GaN based semiconductor.

A transistor 300 according to this embodiment includes a substrate 10, a buffer layer 12 that is formed on the substrate 10, a first semiconductor layer 14 that is formed on the buffer layer 12, a second semiconductor layer 16 that is formed on the first semiconductor layer 14, a third semiconductor layer 18 that is formed on the second semiconductor layer 16, a fourth semiconductor layer 20 that is formed on the third semiconductor layer 18, a fifth semiconductor layer 22 that is formed on the fourth semiconductor layer 20, and an AlN layer 42 that is provided between the second semiconductor layer 16 and the third semiconductor layer 18.

For example, the substrate 10 is made of silicon (Si). In addition to the silicon, sapphire ($Al_2O_3$) or silicon carbide (SiC) can be applied.

The buffer layer 12 has a function of accommodating lattice mismatching between the substrate 10 and the first semiconductor layer 14. The buffer layer 12 is formed with a multi-layer structure such as aluminum gallium nitride (AlxGa1-xN (0<X<1)) or aluminum nitride (AlN).

The first semiconductor layer 14, the second semiconductor layer 16, the third semiconductor layer 18, the fourth semiconductor layer 20, and the fifth semiconductor layer 22 are formed of the first GaN based semiconductor, the second GaN based semiconductor, the third GaN based semiconductor, the fourth GaN based semiconductor, and the fifth GaN based semiconductor, respectively. In addition, the second GaN based semiconductor has a band gap narrower than that of the first GaN based semiconductor. In addition, the third GaN based semiconductor has a band gap wider than that of the second GaN based semiconductor. In addition, the fourth GaN based semiconductor has a band gap narrower than that of the third GaN based semiconductor. In addition, the fifth GaN based semiconductor has a band gap wider than that of the fourth GaN based semiconductor.

Therefore, the transistor 300 has a layer structure in which the second semiconductor layer 16 and the fourth semiconductor layer 20 having the relatively narrow band gaps are interposed by the first semiconductor layer 14, the third semiconductor layer 18, and the fifth semiconductor layer 22 having the relatively wide band gaps. In addition, a magnitude relation of the band gaps of the GaN based semiconductors can be determined by analyzing compositions of the GaN based semiconductors.

For example, the first GaN based semiconductor has a composition represented by $Al_{X1}In_{Y1}Ga_{1-(X1+Y1)}N$ ($0 \leq X1 \leq 1$, $0 \leq Y1 \leq 1$, and $0 \leq X1+Y1 \leq 1$), the second GaN based semiconductor has a composition represented by $Al_{X2}In_{Y2}Ga_{1-(X2+Y2)}N$ ($0 \leq X2 \leq 1$, $0 \leq Y2 \leq 1$, and $0 \leq X2+Y2<1$), the third GaN based semiconductor has a composition represented by $Al_{X3}In_{Y3}Ga_{1-(X3+Y3)}N$ ($0 \leq X3 \leq 1$, $0 \leq Y3 \leq 1$, and $0 \leq X3+Y3<1$), the fourth GaN based semiconductor has a composition represented by $Al_{X4}In_{Y4}Ga_{1-(X4+Y4)}N$ ($0 \leq X4 \leq 1$, $0 \leq Y4<1$, and $0 \leq X4+Y4<1$), and the fifth GaN based semiconductor has a composition represented by $Al_{X5}In_{Y5}Ga_{1-(X5+Y5)}N$ ($0 \leq X5 \leq 1$, $0 \leq Y5 \leq 1$, and $0 \leq X5+Y5<1$).

For example, X1+Y1, X2+Y2, X3+Y3, X4+Y4, and X5+Y5 satisfy relations of X1+Y1>X2+Y2, X3+Y3>X2+Y2, and X5+Y5>X4+Y4. As a result, a magnitude relation of the band gaps is satisfied.

In addition, the first semiconductor layer 14, the second semiconductor layer 16, the third semiconductor layer 18, the fourth semiconductor layer 20, and the fifth semiconductor layer 22 have the thickness ($d_1$), the thickness ($d_2$), the thickness ($d_3$), the thickness ($d_4$), and the thickness ($d_5$), respectively.

The first GaN based semiconductor to form the first semiconductor layer 14 is, for example, undoped AlGaN (aluminum gallium nitride). The first GaN based semiconductor may contain impurities such as C (carbon) to achieve a high breakdown voltage. A thickness ($d_1$) of the first semiconductor layer 14 is, for example, 0.5 μm to 3 μm.

The first semiconductor layer 14 functions as a threshold control layer to increase a potential of the second semiconductor 16 and increase a threshold voltage of the transistor 300. The thickness ($d_1$) of the first semiconductor layer 14 is preferably larger than a thickness ($d_2$) of the second semiconductor layer 16, from the viewpoint of increasing the threshold voltage of the transistor 300.

The second GaN based semiconductor to form the second semiconductor layer 16 is, for example, undoped GaN (gallium nitride). The thickness ($d_2$) of the second semiconductor layer 16 is, for example, 3 nm to 300 nm.

The aluminum nitride (AlN) layer 42 is provided between the second semiconductor layer 16 and the third semiconductor layer 18.

At an interface of the second semiconductor layer 16 and the AlN layer 42, a hetero-junction is formed. At the interface, two-dimensional electron gas (2DEG) is generated and becomes carriers of the transistor 300. That is, the second semiconductor layer 16 functions as an operation layer (carrier layer) of an HEMT and the AlN layer 42 functions as a barrier layer (electron supply layer) of the HEMT. When the AlN layer 42 is thin, the two-dimensional electron gas (2DEG) may not be sufficiently generated.

The third GaN based semiconductor to form the third semiconductor layer 18 is, for example, undoped AlGaN (aluminum gallium nitride). A thickness ($d_3$) of the third semiconductor layer 18 is, for example, 5 nm to 30 nm.

The fourth GaN based semiconductor to form the fourth semiconductor layer 20 is, for example, undoped GaN (gallium nitride). A thickness ($d_4$) of the fourth semiconductor layer 20 is, for example, 3 nm to 50 nm.

The fifth GaN based semiconductor to form the fifth semiconductor layer 22 is, for example, undoped AlGaN (aluminum gallium Nitride). The fifth GaN based semiconductor may be n-type semiconductor. The fifth GaN based semiconductor may contain n-type impurities such as Si (silicon) or Ge (germanium). A thickness ($d_5$) of the fifth semiconductor layer 22 is, for example, 3 nm to 30 nm.

A hetero-junction is formed at the interface of the fourth semiconductor layer 20 and the fifth semiconductor layer 22. At the interface, two-dimensional electron gas (2DEG) is generated and becomes carriers of the transistor 100. That is, the fourth semiconductor layer 20 functions as the operation layer (carrier layer) of the HEMT and the fifth semiconductor layer 22 functions as the barrier layer (electron supply layer) of the HEMT.

The transistor 300 includes a trench 24 in which one end is positioned at the fifth semiconductor layer 22 and the other end contacts the AlN layer 42. The trench 24 is formed to reach the AlN layer 42 by penetrating the fourth semiconductor layer 20 and the third semiconductor layer 18 from a surface of the fifth semiconductor layer 22 using a reactive ion etching (RIE) method.

AlN can decrease an etching rate when the trench 24 is formed, with respect to AlGaN or GaN containing Ga. In other words, AlN can easily obtain high etching selection ratio, with respect to AlGaN or GaN.

Therefore, in the semiconductor device according to this embodiment, etching can be stopped by the AlN layer 42, when the trench 24 is formed. As a result, depth controllability when the trench 24 is formed is improved.

In addition, the gate dielectric 26 is provided on an inner wall of the trench 24. The gate dielectric 26 is provided continuously on the third semiconductor layer 18, the fourth semiconductor layer 20, and the fifth semiconductor layer 22 of the inner wall of the trench 24. The gate dielectric 26 is provided on the AlN 42, the third semiconductor layer 18, the fourth semiconductor layer 20, and the fifth semiconductor layer 22. The gate dielectric 26 is, for example, a silicon oxide film. In addition to the silicon oxide film, other materials such as a silicon nitride film, a silicon oxynitride film, and an aluminum oxide film can be applied. The thickness of the gate dielectric 26 is, for example, 10 nm to 100 nm.

The gate electrode 28 is formed on the gate dielectric 26. The gate electrode 28 is embedded in the trench 24. The gate electrode 28 is provided on the AlN layer 42, the third semiconductor layer 18, the fourth semiconductor layer 20, and the fifth semiconductor layer 22 through the gate dielectric 26 therebetween. The gate electrode 28 is p-type polysilicon in which B (boron) is doped or n-type polysilicon in which P (phosphorus) is doped. In addition to the polysilicon, metal silicide and a metal can be applied to the gate electrode 30.

In addition, the source electrode 30 and the drain electrode 32 are formed on the fifth semiconductor layer 22. The drain electrode 32 is formed at the side opposite to the side of the gate electrode 28 with respect to the source electrode 30.

The source electrode 30 and the drain electrode 32 are, for example, metal electrodes and the metal electrodes are, for example, electrodes using aluminum (Al) as a main component. A portion between the source electrode 30 and the drain electrode 32 and the fifth semiconductor layer 22 is preferably an ohmic contact. A distance between the source electrode 30 and the drain electrode 32 is about 10 μm.

In the transistor 300 according to this embodiment, a surrounding portion of the interface of the AlN layer 42 immediately below the trench 24 and the second semiconductor layer 16 becomes a channel region. The carriers in the channel region are a two-dimensional electron gas generated in a hetero junction of the interface of the AlN layer 42 and the second semiconductor layer 16 or electrons accumulated by applying a gate voltage to the interface of the AlN layer 42 and the second semiconductor layer 16. When the carriers are the accumulated electrons, the channel region of the transistor 300 operates as a metal insulator field effect transistor (MISFET), not the HEMT.

In both cases, similar to the first embodiment, the first semiconductor layer 14 is provided as the threshold control layer below the second semiconductor layer 16. As a result, the potential of the channel region increases and the electron density decreases. Therefore, the threshold voltage of the normally-off transistor can be increased.

In addition, in the transistor 300 according to this embodiment, similar to the first embodiment, an access region where the two-dimensional electron gas is generated is provided at the interface of the fourth semiconductor layer 20 and the fifth semiconductor layer 22. The access region is far from the first semiconductor layer 14, as compared with the channel region. Therefore, an influence of a boosting effect of the potential by the first semiconductor layer 14 is small. Thus, the two-dimensional electron gas density does not decrease and the high carrier density is maintained.

Similar to the first embodiment, a ratio of Al of the fifth semiconductor layer 22 is preferably higher than a ratio of Al of the third semiconductor layer 20, from the viewpoint of increasing the two-dimensional electron gas density of the access region. Thus, X3 and X5 showing the ratios of Al preferably satisfy a relation of X5>X3.

In addition, a ratio of Al of the first semiconductor layer 14 is preferably low, from the viewpoint of lattice matching with the second semiconductor layer 16. Therefore, X1, X3, and X5 preferably satisfy a relation of $X5 > X3 \geq X1$.

In addition, n-type impurities, for example, Si (silicon) are preferably contained in the fifth semiconductor layer 22. The fifth semiconductor layer 22 contains n-type impurities and thus, an electron density of the fifth semiconductor layer 22 increases. Therefore, an amount of electrons supplied to the access region increases and the two-dimensional electron gas density of the access region further increases. Thus, on-resistance of the transistor 300 further decreases.

In addition, a ratio of In (indium) of the fifth semiconductor layer 22 is preferably higher than a ratio of In (indium) of the third semiconductor layer 20. That is, Y3 and Y5 showing the ratios of In preferably satisfy a relation of Y5>Y3. If the ratio of In increases, the two-dimensional electron gas density further increases. Therefore, the two-dimensional electron gas density of the access region increases. Thus, on-resistance of the transistor 300 further decreases. Also, the thickness of the fifth semiconductor layer 22 can decrease and productivity is improved.

In addition, the thickness (d1) of the first semiconductor layer 14 to be the threshold control layer is preferably 0.5 to 3 μm and is more preferably 1 μm or more. In addition, if the thickness is smaller than the thickness in the above range, an effect of increasing the potential may not be sufficiently obtained. In addition, if the thickness is larger than the thickness in the above range, productivity at the time of manufacturing may be lowered.

In addition, the thickness ($d_2$) of the second semiconductor layer 16 to be the operation layer is preferably 3 nm to 200 nm, is more preferably 100 nm or less, and is further preferably 50 nm or less. If the thickness is smaller than the thickness in the above range, it may become difficult to control the thickness. In addition, if the thickness is larger than the thickness in the above range, an effect of increasing the potential may not be sufficiently obtained.

In addition, the thickness ($d_4$) of the fourth semiconductor layer 20 to be the operation layer is preferably 3 nm to 50 nm and is more preferably 5 nm to 20 nm. If the thickness is smaller than the thickness in the above range, it may become difficult to control the thickness. In addition, if the thickness is larger than the thickness in the above range, resistance when electrons move to a sidewall of the trench 24 increases and the on-resistance of the transistor 300 may increase.

In addition, the thickness (d5) of the fifth semiconductor layer 22 to be the barrier layer is preferably 3 nm to 30 nm and is more preferably 5 nm to 10 nm. If the thickness is smaller than the thickness in the above range, it may become difficult to control the thickness. If the thickness is smaller than the thickness in the above range, the electron density of the access region may decrease. In addition, if the thickness is larger than the thickness in the above range, productivity may be lowered.

The thickness of the AlN layer 42 of the bottom portion of the trench 24 is preferably small, from the viewpoint of decreasing an influence of a hetero-interface of the AlN layer 42 and the second semiconductor layer 16 on an operation of the transistor 300. The thickness of the AlN layer 42 of the bottom portion of the trench 24 is preferably 0.5 nm to 2 nm.

As described above, according to the transistor 300 according to this embodiment, both the increase in the threshold voltage of the channel region and the decrease in the resistance of the access region can be realized by introducing the threshold control layer and separating the channel region and the access region. Therefore, a normally-off transistor in which a threshold voltage is high and an on-current is high can be realized. By providing the AlN layer 42, controllability of the trench formation is improved. As a result, the transistor 300 having a stable characteristic can be realized.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor layer of a first GaN based semiconductor;
a second semiconductor layer of a second GaN based semiconductor provided above the first semiconductor layer, the second GaN based semiconductor having a band gap narrower than that of the first GaN based semiconductor;
a third semiconductor layer of a third GaN based semiconductor provided above the second semiconductor layer, the third GaN based semiconductor having a band gap wider than that of the second GaN based semiconductor;
a fourth semiconductor layer of a fourth GaN based semiconductor provided above the third semiconductor layer, the fourth GaN based semiconductor having a band gap narrower than that of the third GaN based semiconductor;
a fifth semiconductor layer of a fifth GaN based semiconductor provided above the fourth semiconductor layer, the fifth GaN based semiconductor having a band gap wider than that of the fourth GaN based semiconductor;
a gate dielectric provided directly on the third semiconductor layer, the fourth semiconductor layer, and the fifth semiconductor layer;
a gate electrode provided on the gate dielectric;
a source electrode provided above the fifth semiconductor layer; and
a drain electrode provided above the fifth semiconductor layer at the side opposite to the side of the gate electrode with respect to the source electrode.

2. The device according to claim 1, wherein a thickness of the first semiconductor layer is larger than a thickness of the second semiconductor layer.

3. The device according to claim 1, wherein a thickness of the second semiconductor layer is 300 nm or less.

4. The device according to claim 1, wherein a thickness of the third semiconductor layer is 5 nm to 30 nm.

5. The device according to claim 1, wherein the fifth semiconductor layer is n-type semiconductor.

6. The device according to claim 1, wherein the first GaN based semiconductor has a composition represented by $Al_{X1}In_{Y1}Ga_{1-(X1+Y1)}N$ ($0 \leq X1 \leq 1$, $0 \leq Y1 \leq 1$, and $0 \leq X1+Y1 < 1$), the second GaN based semiconductor has a composition represented by $Al_{X2}In_{Y2}Ga_{1-(X2+Y2)}N$ ($0 \leq X2 \leq 1$, $0 \leq Y2 \leq 1$, and $0 \leq X2+Y2 < 1$), the third GaN based semiconductor has a composition represented by $Al_{X3}In_{Y3}Ga_{1-(X3+Y3)}N$ ($0 \leq X3 \leq 1$, $0 \leq Y3 \leq 1$, and $0 \leq X3+Y3 < 1$), the fourth GaN based semiconductor has a composition represented by $Al_{X4}In_{Y4}Ga_{1-(X4+Y4)}N$ ($0 \leq X4 \leq 1$, $0 \leq Y4 \leq 1$, and $0 \leq X4+Y4 < 1$), and the fifth GaN based semiconductor has a composition represented by $Al_{X5}In_{Y5}Ga_{1-(X5+Y5)}N$ ($0 \leq X5 \leq 1$, $0 \leq Y5 \leq 1$, and $0 \leq X5+Y5 < 1$).

7. The device according to claim 6, wherein X1+Y1, X2+Y2, X3+Y3, X4+Y4, and X5+Y5 satisfy relations of X1+Y1>X2+Y2, X3+Y3>X2+Y2, and X5+Y5>X4+Y4.

8. The device according to claim 6, wherein X1, X3, and X5 satisfy a relation of $X5>X3\geq X1$.

9. The device according to claim 6, wherein Y3 and Y5 satisfy a relation of $Y5>Y3$.

* * * * *